United States Patent [19]

Boast

[11] 3,988,541
[45] Oct. 26, 1976

[54] METHOD AND APPARATUS FOR FREQUENCY COMPENSATION OF ELECTRO-MECHANICAL TRANSDUCER

[75] Inventor: Warren B. Boast, Ames, Iowa

[73] Assignee: Iowa State University Research Foundation, Inc., Ames, Iowa

[22] Filed: Jan. 14, 1975

[21] Appl. No.: 540,806

[52] U.S. Cl. .............................. 179/1 D; 179/1 A
[51] Int. Cl.² ..................................... H04R 3/04
[58] Field of Search ............... 179/1 A, 1 D, 1 R

[56] References Cited

UNITED STATES PATENTS

| | | | |
|---|---|---|---|
| 1,478,078 | 12/1923 | Wente | 179/1 D |
| 2,253,186 | 8/1941 | Loye et al. | 179/1 D |
| 3,061,676 | 10/1962 | Wirth | 179/1 D |
| 3,624,298 | 11/1971 | Davis et al. | 179/1 D |
| 3,752,928 | 8/1973 | Flickinger | 179/1 A |
| 3,803,359 | 4/1974 | Corderman | 179/1 D |
| 3,849,602 | 11/1974 | Gendin | 179/1 D |

OTHER PUBLICATIONS

"Design of Acoustic Systems by Electromechanical Analogies" D. Fidelman Radio & Television News vol. 44 No. 2 pp. 12A–14A, Aug. 1950.

Primary Examiner—George G. Stellar
Attorney, Agent, or Firm—Dawson, Tilton, Fallon & Lungmus

[57] ABSTRACT

The inherent dependency upon frequency of the response of an electro-mechanical transducer is compensated over a wide frequency range by driving the transducer with a current source, the signal of which is modified to have a frequency characteristic which is the complement of the frequency characteristic of the mechanical response parameters of the transducer.

20 Claims, 15 Drawing Figures

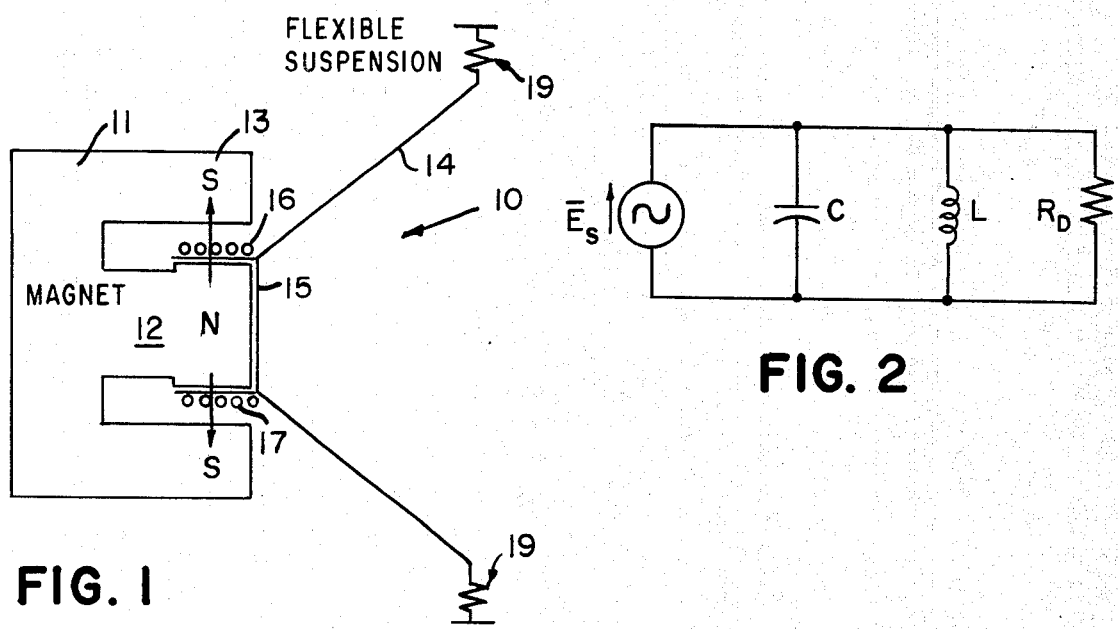
FIG. 1
FIG. 2
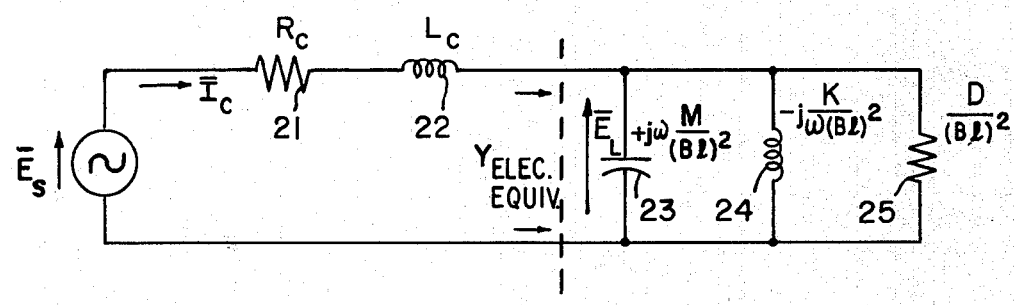
FIG. 3
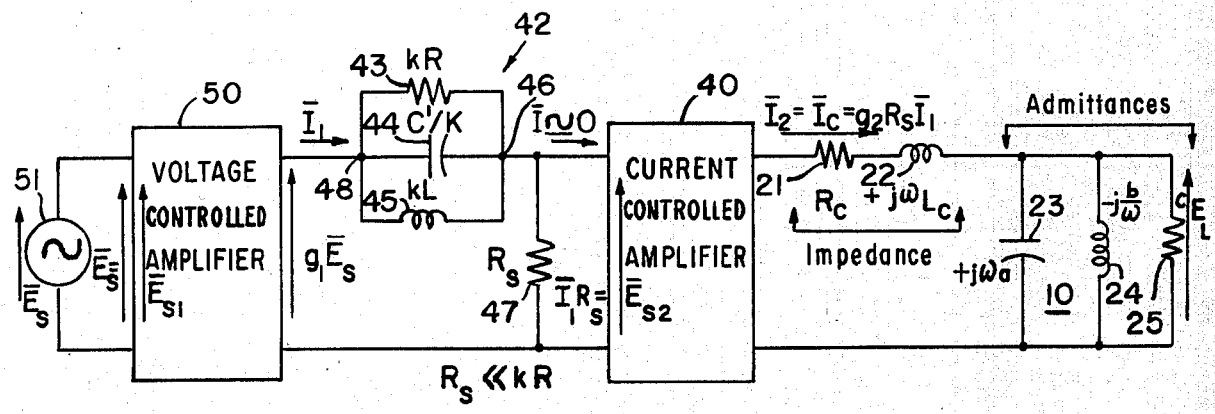
FIG. 5
FOR COMPENSATION
1) $k\left[R = \dfrac{1}{c} = \dfrac{(B\ell)^2}{D}\right]$
2) $k\left[L = \dfrac{1}{b} = \dfrac{(B\ell)^2}{K}\right]$
3) $\dfrac{1}{k}\left[C' = a = \dfrac{M}{(B\ell)^2}\right]$

FIG. 4A INPUT IMPEDANCE FOR MECHANICAL RESPONSE PARAMETERS EQUIVALENTS.

FIG. 4B TOTAL INPUT IMPEDANCE INCLUDING OHMIC RESISTANCE AND SELF-INDUCTANCE OF TRANSDUCER.

METHOD AND APPARATUS FOR FREQUENCY COMPENSATION OF ELECTRO-MECHANICAL TRANSDUCER

BACKGROUND AND SUMMARY

The present invention relates, in general, to a broad class of transducers which are herein referred to as "electro-mechanical" transducers. It is intended that this class of transducers includes microphones, speakers, relays, linear or rotational motors, and even servomotors or other transducers wherein the mechanical response characteristics of the transducer include some mass or moment of inertia, some elasticity, such as a spring suspension system, and some loss or dissipation.

It is known that transducers of this general type have an inherent dependency upon, or sensitivity to, the frequency of the signal which drives the transducer. The present invention is particularly directed to compensate for, and therefore substantially eliminate the effects of this inherent frequency dependency of the mechanical response of a transducer.

In a general sense the present invention relates to a class of devices which operate on the Bli principle—namely a force is produced on a current-carrying conductor in a magnetic field. The meaningful output may be velocity as in the case of a moving coil type of speaker or it may be displacement as with the recording head for a chart recorder.

In a speaker of the type mentioned, there is mass (the mass of the cone and transducer coil), and elasticity or spring parameter (in the suspension system for the cone and coil), and some loss (including the dissipation in the cone and the work performed in vibrating the air to generate the acoustic radiation).

These three parameters of mass, spring parameter, and loss are referred to herein as the "mechanical response parameters" of the transducer. As mentioned, they inherently produce a frequency dependency of the mechanical response to an electrical signal.

In addition to the mechanical response parameters indicated above, a transducer of the type with which the present invention is concerned, particularly audio speakers, has an ohmic loss and self-inductance which may alter the response characteristic of the transducer.

The present invention can best be understood from the detailed analysis of the problem and specific solution presented below; however, in brief, the present invention provides a current-controlled power amplifier (that is, one which has a very high output impedance in comparison to the load so that its output current is substantially independent of load impedance) for driving the speaker. In other words, a "current-controlled amplifer" is one in which the output current of the amplifier is controlled by the input signal (either voltage or current) and it is independent of load impedance. In this manner, the impedance of the transducer coil caused by its ohmic resistance and self-inductance have no distorting frequency effect because the current-controlled power amplifier forces the desired current into any electrical load having an impedance value from a short circuit (zero impedance) to the highest impedance within the power rating of the amplifier.

The use of a current-controlled power amplifier to drive the speaker, therefore, overcomes the frequency-dependency of the electrical parameters of the speaker coil, but it does not compensate for the frequency dependency of the mechanical response parameters of the speaker.

To compensate for the frequency dependency of the mechanical response parameters of the speaker, the input signal of the current-controlled amplifier (or simply "current amplifier") is modified to have a frequency characteristic which is the complement of the corresponding frequency characteristic of the mechanical response parameters of the transducer. In this context, term "complement" is intended to mean that the input signal is large when the mechanical response is small and vice versa. Detailed analysis presented below will more precisely define the meaning.

In the illustrated embodiments, this modification of the current drive signal is accomplished through the use of a scaled electrical network which is a model of the mechanical response parameters of the transducer. That is to say, the input signal to the current power amplifier is derived by applying the input voltage signal, after amplification, to an electrical network, the elements of which are selected and designed to be the electrical counterparts of the equivalent circuit of the actual mechanical parameters of the speaker. This is sometimes referred to as the "modeled electrical network" or "compensation network"; and it will be explained in greater detail within. In summary, then, the input electrical signal acts upon the modeled electrical network so as to modify that input signal in such a manner that the resulting signal has a frequency characteristic which is the complement of the corresponding frequency characteristic of the mechanical response parameters of the speaker. This resulting signal is then used to drive a current amplifier which, in turn, drives the speaker.

The result is an overall response for the system which is substantially independent of frequency.

The present invention finds particular utility in the field of high-fidelity sound reproduction where heretofore the principal element of such a system limiting fidelity of the reproduction has been the speaker. In order to overcome this problem and to achieve better fidelity, the effort has been to design better speakers because the frequency response of the electrical portion of the system has not been matched by the frequency response characteristic of the speakers. The present invention, then, provides an economical and convenient method of modifying the overall system response for any speaker, even an inexpensive one, to achieve system performance with a much improved frequency response, and therefore higher fidelity. As mentioned, this may be accomplished even with inexpensive speakers.

Further, in order to achieve improved results, the modeled electrical network need not match perfectly with the frequency characteristic of the mechanical response parameters of the speaker at all frequencies of interest. An improved response will be obtained, as will be discussed, if the matching occurs at only a finite number of frequencies such as at resonance, at a frequency lower than resonance, and at one or more frequencies higher in the audio spectrum.

Another advantage of the present invention is that it permits simulation of any of the mechanical response parameters which may be non-linear or itself have a frequency dependency. Further, such simulation may be accomplished in the exact circumstances in which the speaker is intended to be used. For example, I have found that slight variation may occur in the mechanical response characteristics of the speaker when it is enclosed or mounted in a cabinet.

In still another aspect of the invention, there is disclosed a method for determining the exact values of the elements in the modeled electrical network for a given speaker.

The audio frequency response to a room in which the system may be operated, may in itself be imperfect. The room response may be modeled by the methods of this invention and compensation may be included as part of the total electrical model to provide improved audio response of the total system composed of the speaker system operating in the room.

Other features and advantages of the present invention will be apparent from the following detailed description accompanied by the attached drawing.

The Drawing

FIG. 1 is a schemtic drawing illustrating the mechanical response parameters of a speaker;

FIG. 2 is an electrical schematic diagram showing the admittance parameters of an equivalent circuit for the mechanical response parameters of the coil of FIG. 1;

FIG. 3, is an electrical schematic diagram similar to FIG. 2, but including the equivalent circuit for the speaker coil;

FIG. 4A is an idealized graph showing the electrical impedance of the mechanical response parameters of the coil of FIG. 1, as a function of frequency;

FIG. 4B is an idealized graph showing the total input impedance of the coil, including both mechanical and electrical parameter;

FIG. 5 is a current schematic diagram, partly in functional block form, of a system which includes compensation for the frequency-dependent mechanical response parameters of a speaker;

Figure 6:
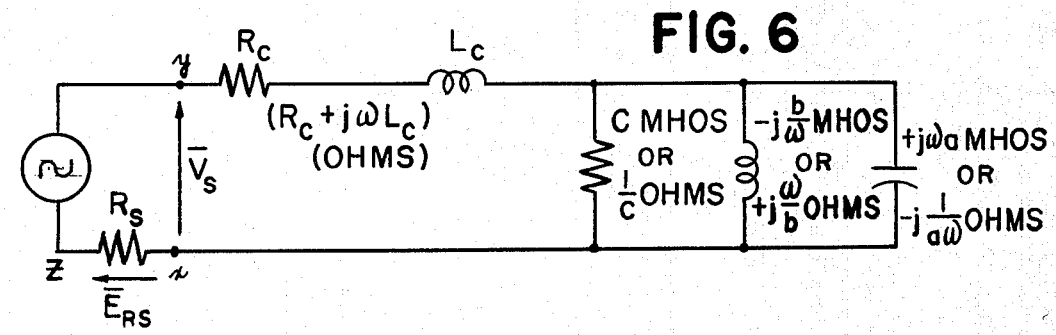
Figures 7, 8:
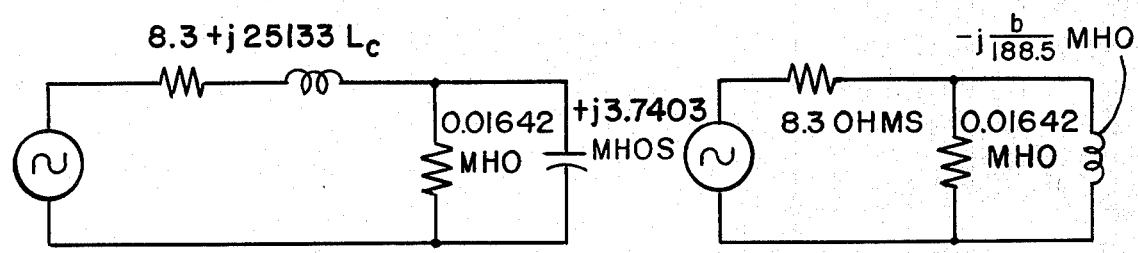
Figure 12:
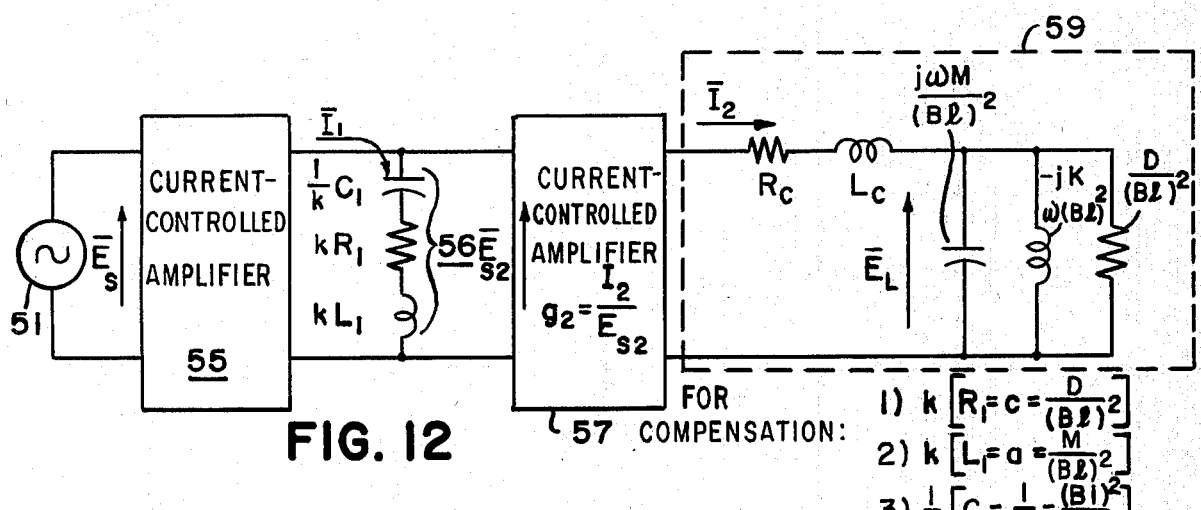
Figure 13:
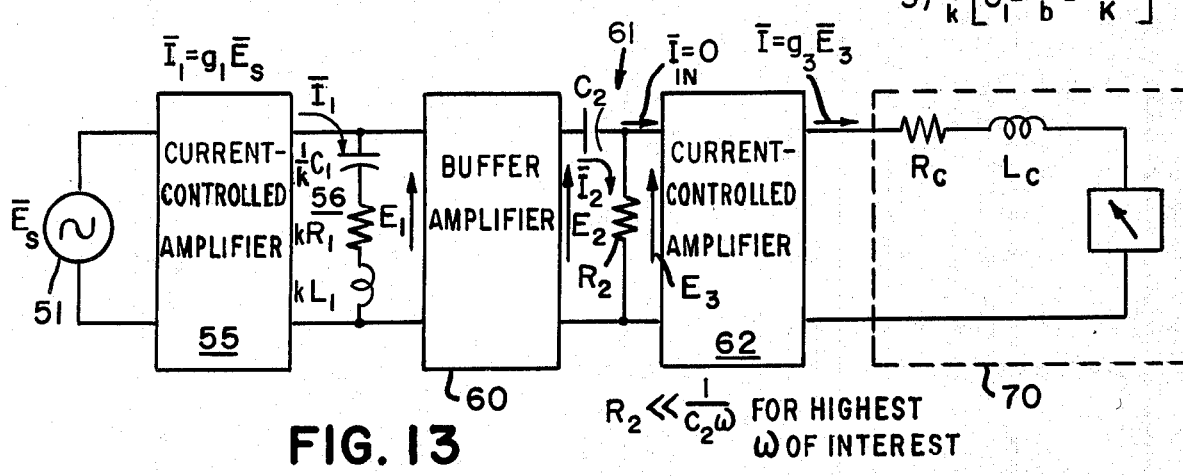
Figure 9:
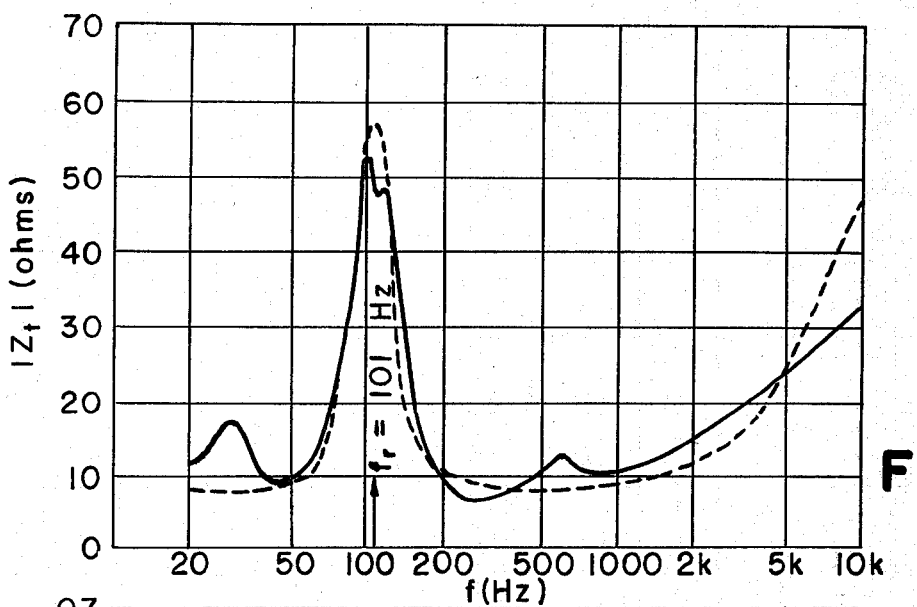
Figure 10:
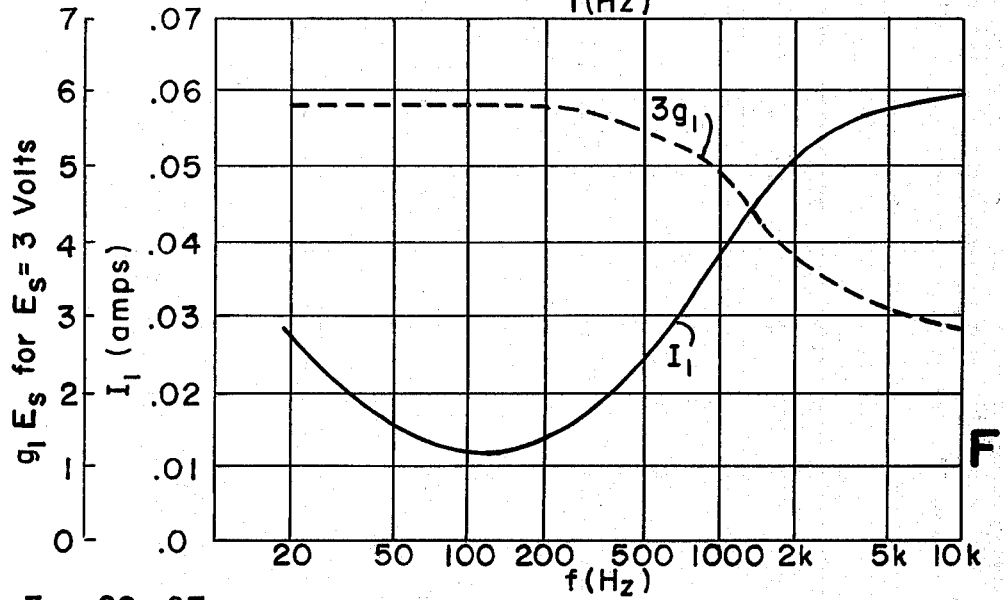
Figure 11:
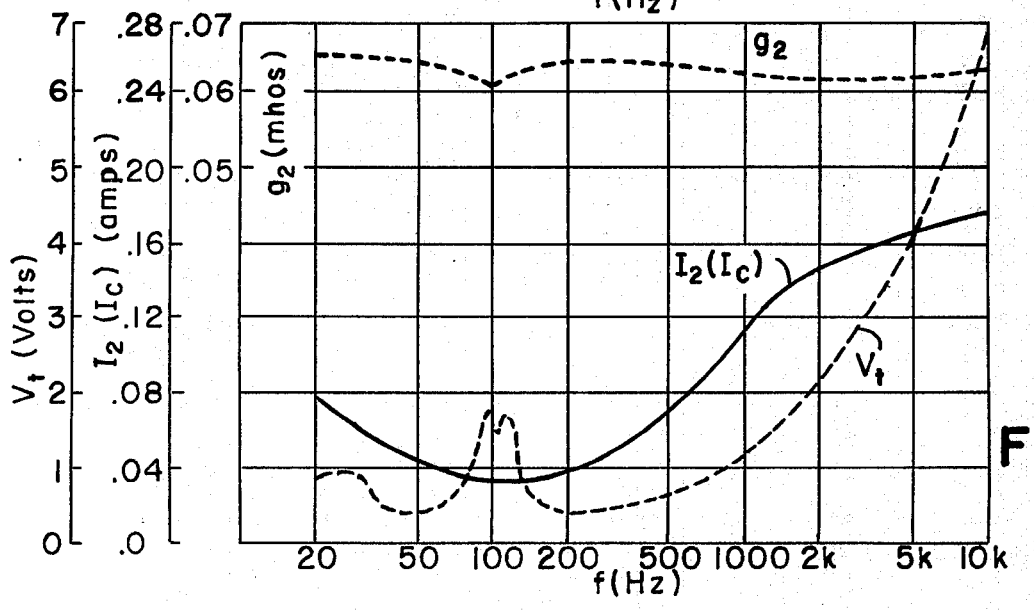

FIGS. 6—8 are circuit schematic diagrams illustrating a method of determining circuit values for the model or compensation electrical network;

FIGS. 9–11 illustrate performance data for an amplifier and speaker system constructed according to the invention;

FIG. 12 is a circuit schematic diagram partly in functional block form, of an alternative system which includes compensation for the frequency-dependent mechanical response parameters of a speaker; and FIG. 13 is a functional block diagram of an electrical system for compensation for the frequency dependency of the mechanical response characteristics of a strip chart recorder.

Detailed Description

Referring to FIG. 1, there is shown a diagrammatic view, in cross section, of an electrical speaker generally designated by reference numeral 10. The speaker includes a magnet 11 having a central leg 12 and an annular outer leg 13. The central leg, in the illustration, is polarized as a north pole, indicated by N; and the annular peripheral portion 13 is polarized as a south pole, indicated by S.

The speaker 10 also includes a diagram 14 which is provided with a central cone 15 surrounding the distal portion of the central leg 12 and about which is wound a coil designated 16. The poles of the magnet 11 are separated, as illustrated, to define an annular air gap generally designated 17 in which the movable voice coil 16 is located.

As a current is passed through the coil 16, a force is exerted on the coil according to the well-known relationship $$f_g = Bli$$

where, $f_g$ is the force on the coil,
B is the flux density in the air gap,
l is the length of the coil, and
i is the current flowing through the coil.

The force $f_g$ of course, is a vector, and the direction of the force depends upon the polarity of the current, but in either case, it is parallel to the axis of the central leg 12 of the magnet.

The diaphragm 14 is mounted by conventional means comprising a flexible suspension system generally designated by reference numeral 19.

For a mechanical system of this type, the velocity, $v(t)$ of the coil and cone displacement is related to the force function, $f_g(t)$ and the mechanical parameters of the system through the equation:

$$f_g(t) = M \frac{dv(t)}{dt} + Dv(t) + K \int v(t)dt \qquad (1)$$

where, M is the mass of the combined speaker cone and voice coil,

D is the frictional and power dissipation parameter of the system, including any losses in the moving coil suspension system itself, and more importantly, the power dissipation required to move the air in front of the cone which, in turn, causes the acoustical radiation from the system, and K is the spring action of the cone suspension.

Assuming that the parameters M, D and K are constants (that is, they do not vary with time or frequency, nor with the amplitude of the force or velocity acting on them) and that an alternating current, $i(t)$, of a single frequency exists in the voice coil, the solution for the harmonic driving function in phasor form can be expressed as:

$$\overline{V} = \frac{\overline{F}_g}{\sqrt{D^2 + (\omega M - K/\omega)^2}} \qquad (2)$$

where, $\overline{V}$ is the RMS value of the harmonically varying velocity $v(t)$,
$F_g$ is the RMS value of the voice coil force $f_g(t)$, and
$\omega$ is $2\pi f$ where $f$ is the single frequency of the alternating current exciting the coil.

Equation (2) will be recognized as the characteristic equation of a second order simple mechanical system including a loss, a spring constant, and mass; and it corresponds to a simple electrical circuit driven by a single frequency source wherein the circuit includes resistance, inductance and capacitance.

The electrical equivalent circuit of the mechanical response parameters of the transducer will now be derived.

The ratio $\overline{V}/\overline{F}_g$ can be defined as the mechanical admittance of the single body mechanical system, i.e., it is the oscillatory velocity, $\overline{V}$, which the mechanical system admits when an oscillatory force $\overline{F}_g$ acts upon it. The denominator of Eq. (2) is the reciprocal of this admittance.

Returning now to instantaneous values, the force component of Eq. (1) caused by the mass M, that is $f_M$, is $$f_M(t) = M \frac{dv(t)}{dt} \qquad (3)$$

If the velocity is oscillatory at a single frequency, $$v(t) = V_{max} \sin 2\pi ft = V_{max} \sin \omega t \qquad (4)$$

Then the component of force $f_M$ is $$f_M(t) = \omega M V_{max} \cos \omega t. \qquad (5)$$

The velocity may be expressed as a phasor of RMS value $\bar{V}$, and the force component associated with the mass M is $$\bar{F}_M = +j \omega M \bar{V} \text{ (where } j = \sqrt{-1}). \qquad (6)$$

In similar fashions $$\bar{F}_k = \frac{K\bar{V}}{+j\omega} = -j K\bar{V}/\omega \qquad (7)$$

and $$\bar{F}_D = D\bar{V} \qquad (8)$$

The total set of component forces are equal to the applied force $\bar{F}_a$, all as phasors, and $$\bar{F}_a = [+j (\omega M - K/\omega) + D]\bar{V} \qquad (9)$$

or $$\frac{\bar{V}}{\bar{F}_a} = \frac{1}{j(\omega M - K/\omega) + D}. \qquad (10)$$

In the above equation, $D$ represents the dissipation due to both frictional losses in the cone and the power consumed to generate the accoustical power.

The force $f_a(t)$ of Eq. (1) is produced by the action of the current, $i_c(t)$, in the voice coil and it may also be expressed as:

$$f_a(t) = Bli_c(t). \qquad (11)$$

The product of $f_a(t) v(t)$ is the mechanical power produced, and the product of $e_L(t) i_c(t)$ is the power in electrical form which is transferred to mechanical power at the voice coil, where $e_L(t)$ is the reaction voltage or self-induced voltage of the coil caused by the motion of the coil in the magnetic field.

$$f_a(t) v(t) = e_L(t) i_c(t). \qquad (12)$$

For a single frequency action, these instantaneous forms can be expressed as phasors if $\bar{F}_a$ and $\bar{V}$, and $\bar{E}_L$ and $\bar{I}_c$ are in phase as $$\bar{F}_a \bar{V} = \bar{E}_L \bar{I}_c \qquad (13)$$

and $$\bar{E}_L = \frac{\bar{F}_a \bar{V}}{\bar{I}_c} \qquad (14)$$

Substituting $\bar{F}_a = Bl\bar{I}_c$ gives $$\bar{E}_L = Bl\bar{V} \qquad (15)$$

The active electrical admittance of the transducer system viewed from the amplifier circuit at the point of conversion to mechanical power (that is, ignoring for the moment the ohmic resistance and the inductance of the coil) is:

$$Y \text{ elec. equiv.} = \frac{\bar{I}_c}{\bar{E}_L} = \frac{\bar{F}_a/(Bl)}{(Bl)\bar{V}} = \frac{1}{(Bl)^2} \frac{\bar{F}_a}{\bar{V}} \qquad (16)$$

Substituting $\bar{F}_a/\bar{V}$ from Eq. (10) gives $$Y \text{ elec. equiv.} = \frac{1}{(Bl)^2}[j(\omega M - K/\omega) + D] \qquad (17)$$

Referring to FIG. 2, the admittance of an electrical circuit of capacitor C and inductor L and a resistor $R_D$ for a single frequency is $$Y = +j \omega C - j(1/\omega L) + (1/R_D) \qquad (18)$$

Comparing equations (17) and (18) gives the equivalent electrical parameters at the point of power conversion as $$C = \frac{1}{(Bl)^2} M \qquad (19)$$

$$L = (Bl)^2/K \qquad (20)$$

$$R_D = (Bl)^2/D \qquad (21)$$

Considering the ohmic resistance, $R_c$, and the self-inductance, $L_c$, of the voice coil, the total system is shown as electrical equivalents in FIG. 3.

The variable frequency responses of the mechanical system at the point of the transducer (Y elec. equiv.) is shown to the right of the dashed line and is that at the point of power conversion from electrical to mechanical form. Simplifying the notation by letting $$a = \frac{M}{(Bl)^2} \qquad (22)$$

$$b = K/(Bl)^2 \qquad (23)$$

and $$c = [D/(Bl)^2] \qquad (24)$$

yields $$Y \text{ elec. equiv.} = j(a\omega - b/\omega) + c \qquad (25)$$

Still referring to FIG. 3, in summary, the resistor 21 is the ohmic resistance of the voice coil, the inductor 22 is the self-inductance of the voice coil. The capacitor 23 represents the electrical equivalent of the mechanical response parameter, namely the mass of the cone and voice coil. The inductor 24 represents the electical equivalent of the spring suspension of the cone and voice coil, and the resistor 25 represents the electrical equivalent of the mechanical response parameter dissipation, including dissipation due to friction losses in the cone and due to radiating the acoustical power.

Summarizing still further, from an electrical viewpoint, it can be said that a terminal voltage $\bar{E}_S$ is impressed upon the terminals of the transducer, resulting in a current $\bar{I}_C$. This current acts upon the electrical equivalents of the mechanical response parameters of the transducer to move the mass (capacitor 23), overcome the force of the spring suspension (indicator 24), and overcome the friction of the cone and produce acoustical power (resistor 25.) The motion of the coil 16 in the magnetic field in the air gap 17 of FIG. 1 produces the voltage $\bar{E}_L$ which is referred to as the reaction voltage or self-induced voltage of the coil. Basically, it is a back emf produced by moving a current-carrying conductor in a magnetic field. This reaction voltage $\bar{E}_L$ is not observable at the terminals of the transducer because of the drops across the coil resistor 21 and coil inductor 22 caused by the coil current $\bar{I}_c$.

Turning now to FIG. 4A, there is shown a calculation of the magnitude (i.e., the absolute value) of the impedance of the mechanical response parameters, for example, as shown in FIG. 2, for a transducer of the type under discussion as a function of frequency. In FIG. 4A, the abscissa is frequency and the ordinate is the impedance. It is merely shown to illustrate the relationship of impedance to frequency.

In other words, the graph of FIG. 4A represents the impedance looking into the terminals crossed by the dashed line in FIG. 3 and representing only the mechanical response parameters of the transducer. Looking into the actual physical terminals of the transducer, one would obtain an impedance vs. frequency curve such as the solid curve of FIG. 4B, taking into account the ohmic resistance and the self-inductance of the coil. The ordinates of this curve are calculated from the magnitude of the voltage across the terminals of the voice coil divided by the magnitude of the resulting current flowing in the coil, each pair of voltage and current values being measured at a discrete frequency with distribution over the audible range.

The velocity $\bar{V}$ of the cone determines the acoustic radiation level of sound. The velocity is related to the reaction voltage $\bar{E}_L$ of the core by equation (15). It will be remembered that the reaction voltage $\bar{E}_L$ is the terminal voltage of the transducer, less, in a phasor sense, the voltage drop across the resistance $R_c$ and the inductanct $L_c$ of the voice coil.

Referring to FIG. 4A, the point of maximum impedance 33 occurs at the resonant frequency for the mechanical response parameters of the transducer. For frequencies below resonance, the impedance decreases because of the low impedance of the inductor 24; and for frequencies above resonance, the impedance decreases due to the effects of the capacitor 23. In a sense, when one considers only the mechanical response parameters of the transducer, the capacitor 23 and the inductor 24 may be thought of as a parallel tuned circuit which exhibits a maximum impedance at resonance. When this tuned circuit exhibits a maximum impedance, a maximum portion of the current $\bar{I}_c$ flows through the resistor 25 and produces a maximum of acoustical response (that is, sound level). For frequencies below resonance, the spring suspension system of the cone appears relatively small and much of the force produced by the coil current $\bar{I}_c$ is used in displacing the cone a relatively large distance, but it is velocity, not distance, which produces sound intensity. At frequencies higher than resonance, much of the force of the current $\bar{I}_c$ is required to move the mass of the coil and cone since, at the higher velocities, more force is required to keep the displacement of the coil in synchronism with the instantaneous value of the excitation current.

It is the relationship of the impedance of the mechanical response parameters of the transducer, as illustrated in FIG. 4A, and as explained above together with the effects of the resistance and self-inductance of the coil 16, which accounts for the deviation in response to the transducer as a function of frequency.

Turning now to FIG. 5, the electrical equivalents of the mechanical response parameters of the transducer, together with the ohmic resistance and self-inductance of the coil 16 are repeated at the right-hand side of the drawing. Driving the speaker 10 is a current-controlled amplifier (i.e., it is the output current which is controlled) designated 40. The current amplifier 40 is a linear amplifier over a predetermined amplitude and frequency range using current feedback to achieve a high output impedance. There are many designs of current amplifiers known in the art, and the techniques for designing current amplifiers to operate from either voltage or current input signals are also well known in the art. Thus, the amplifier may or may not have a voltage gain (for example, in an emitter follower which is one type of current amplifier, the voltage gain is slightly less than unity). The frequency range of the amplifier 40 will be in accordance with the overall design requirements of the system. Its "gain" which is actually an admittance under this definition may be defined as $$G_2 = \frac{I_2}{E_{i2}} \tag{26}$$

In the circuit of FIG. 5, in front of the current amplifier 40 there is an electrical network generally designated 42, comprising a resistor 43, a capacitor 44, and an inductor 45, all connected in parallel. The network 42 is a scaled model of the electrical equivalent of the mechanical response parameters of the speaker 10 according to the following relationships:

The value of the resistor 43 in ohms (times a scale factor $k$, if used) is equal to the resistance of the resistor 25, which in turn is equal to the reciprocal of the dissipation in the speaker divided by $(Bl)^2$, or $k[R_{43} = (Bl)^2/D]$ ohms;

The value of the capacitor 44 in farads (divided by the scale factor $k$, if used) is equal to the capacitance of capacitor 23, which in turn is equal to the mas of the cone and coil divided by $(Bl)^2$, or $1/k \ [C_{44} = M/(Bl)^2]$ farads.

The value of the inductor 45 in henrys (times the scale factor $k$, if used) is equal to the inductor 24, which in turn is equal to the reciprocal of the spring constant of the suspension system divided by $(bl)^2$, or $k[L_{45} = (Bl)^2/K]$ henrys.

In other words, the electrical network 42 is a scaled model of the mechanical response parameters of the transducer in the sense that the dissipation of the transducer (including both friction and acoustical radiation represented by resistor 25) is represented by the resistor 43 in the model network 42. Similarly, the electrical equivalent of mass of the transducer is represented by the capacitor 44, and the electrical equivalent of the spring parameter 24 is represented by the inductor 45.

The right-hand terminal 46 of the model network 42 is connected in the embodiment shown to one terminal of a resistor 47 which, in turn, is connected across the input terminals of the current amplifier 40. The left-hand terminal 48 of the model network 42 is connected to the signal output terminal of a voltage amplifier 50. The voltage amplifier 50 is a linear amplifier over a predetermined amplitude and frequency range using voltage feedback to achieve a low output impedance and a constant voltage gain. Again, many techniques are known for designing such amplifiers to operate from either voltage or current input signals. The input to the voltage amplifier 50 is the signal desired to be reproduced, represented by the generator 51, the signal being designated $\bar{E}_s$.

In explaining the operation of the system of FIG. 5, the current amplifier 40 will sometimes be referred to as the "power-amplifier" stage, and the voltage amplifier 50 will sometimes be referred to as the "signal processing" stage.

Operation

One way to look at the operation of the system of FIG. 5 is to recognize that the input signal to the power amplifier is modified or "processed" by the insertion of the model or "compensation" network 42 in such a manner that its frequency characteristics are exactly the complement of the frequency characteristics of the mechanical response characteristics of the speaker. Hence, the network 42 compensates for the nonlinear characteristic of the mechanical response of the speaker. In other words, for frequencies above resonance, the impedance of the model network 42 reduces so as to admit the passage of more driving current through the model network. At this higher frequency, it will be observed, the transducer is also less efficient in converting electrical power into acoustical power because of the extra force required to move the mass of the speaker coil and cone. Because of the greater overall gain of the system before the power amplifier, due to the exact modeling of the network 42, more current will be available at these higher frequencies into the speaker, and it will be available exactly in proportion to, and hence compensate for, the amount by which the power conversion efficiency of the speaker is reduced. Thus, the overall system response will not be diminished.

Similarly, for frequencies lower than the resonant frequency, the impedance of the network 42 will also be decreased so as to admit the passage of more current through the model network in a manner exactly compensating for the reduced efficiency of the speaker in converting electrical power to acoustical power because of the spring suspension system. Again, due to the electrical modeling of the mechanical response parameters, the signal into the power stage will be increased exactly in proportion to the amount needed in the speaker to produce a response equal to that at resonance.

Furthermore, by virtue of driving the speaker with a power amplifier whose output current is controlled, using current feedback in contrast to the more usual voltage feedback, the impedance of the transducer coil including the ohmic resistance $R_c$ and the self-inductance $L_c$, designated respectively 21 and 22 in FIG. 5, will not have a substantial distorting frequency effect. The high output impedance of the current amplifier 40 will force the desired current into any electrical circuit possessing any impedance value from zero impedance to the highest impedance within the power rating of the amplifier.

The amplifier 40 in the embodiment shown preferably has a high input impedance also so that it draws negligible current, and the value of resistor 47, designated $R_s$ is negligible compared to the value of resistor 43, including scaling, if any. The scaling of the parameters of the network 42 by the factor $k$ may be used to bring the impedance of the network to a suitable level, depending upon the availability of model circuit parameters, and also considering the input impedance of the amplifier 40 and the output impedance of the voltage amplifier 50. By using this electrical model network as the load for a voltage amplifier or one using voltage feedback, the resulting current, designated $\bar{I}_1$ will have a frequency characteristic which is the exact complement of the frequency characteristic of the mechanical response parameters of the speaker 10. If the input impedance of the amplifier 40 is negligibly small relative to the impedance levels of the network 42, this current can be used directly to drive the power amplifier. If the input impedance of the amplifier 40 is not negligibly small, then, as illustrated in FIG. 5, a shunt resistor 47 is used to derive a voltage signal from the current $\bar{I}_1$. As mentioned, the value of resistor 47 must be negligibly small (for example, less than 1/10) of the value of the scaled model resistor 43 representing the total dissipation of the mechanical response parameter of the speaker system.

No impedance corresponding to the transducer impedances 21, 22 are necessary or desirable in the model network 42.

Proceeding now to a more rigorous analysis of the system of FIG. 5, $R_s$ (or the input impedance to the next amplifier if directly driven by $\bar{I}_1$ as a current input-current output amplifier) is assumed negligibly small with respect to $kR$ (the lowest impedance of the model network at resonance) the current $\bar{I}_1$ is $$\bar{I}_1 = g_1 \bar{E}_s \ [\frac{1}{kR} + j \ (\frac{\omega C'}{k} - \frac{1}{\omega kL})] \qquad (27)$$

and the output current of the second (power driver) amplifier is $$\bar{I}_2 = g_2 R_s \bar{I}_1 = \frac{g_1 g_2 R_s \bar{E}_s}{k} \ [\frac{1}{R} + j \ (\omega C' - 1/\omega L)] \qquad (28)$$

and this current acts upon the speaker equivalent impedance $Z_{in}$ to produce $\bar{E}_L$.
Thus $$\bar{E}_L = \bar{I}_2 \ Z_{in} = \frac{\bar{I}_2}{\bar{Y}_{in}} = \frac{\bar{I}_2}{c + j \ (\omega a - b/\omega)} \qquad (29)$$

and substituting Eq. (28) gives $$\bar{E}_L = \frac{\frac{g_1 g_2 R_s \bar{E}_s}{k} \ [\frac{1}{R} + j \ (\omega C' - 1/\omega L)]}{c + j \ (\omega a - b/\omega)} \qquad (30)$$

or substituting for $a$, $b$, and $c$ the electrical equivalent elements $a = C'$, $b = 1/L$ and $c = 1/R$ $$\overline{E}_L = \frac{g_1 g_2 R_s \overline{E}_s}{k} \cdot \frac{\frac{1}{R} + j(\omega C' - 1/\omega L)}{\frac{1}{R} + j(\omega C' - 1/\omega L)} = \frac{g_1 g_2 R_s \overline{E}_s}{k} \quad (31)$$

and the acoustical velocity $\overline{V}$ is $\overline{E}_L/B1$, so $$\overline{V} = \frac{g_1 g_2 R_s \overline{E}_s}{kB1} \quad (32)$$

and there is no distortion in either magnitude or phase of mechanical velocity for any frequency component of the input signal.

Method for Constructing the Electrical Model of an Existing Speaker

The sizes of three electrical elements consisting of a capacitor $C' = a$, an inductor $L = 1/b$ and a resistor $R = 1/c$ need to be established in the model electrical network. The $a$, $b$ and $c$ represent the mass–$M/(B1)^2$, the spring suspension system of the cone–$K/(B1)^2$ and the loss and dissipation parameters of the cone–$-D/(B1)^2$, respectively.

Not needed in the model but desirable for checks on the consistency of data on system performance are the resistance $R_c$ and self inductance $L_c$ of the transducer coil.

Of the five parameters ($a$, $b$, $c$, $R_c$ and $L_c$), only $R_c$ can be measured directly by a simple electrical test. Its low-frequency value can be obtained by a simple ohmmeter measurement looking into the terminals of the speaker.

All other parameters may be obtained from an analysis of the impedance behavior looking in at the terminals of the transducer coil as a function of frequency as the speaker is excited or driven by an amplifier which in turn is excited by a sine-wave signal generator. The type of amplifier (whether voltage or current controlled) is not important. It is only important that its output possesses a good sinewave waveshape at all frequencies in the audio range (as low as possible and up to 10 kilohertz or more).

The voltage applied to the transducer coil can be measured by a good AC vacuum-tube voltmeter (high input impedance) and the current to the coil can be obtained from the same instrument by measuring the voltage drop across a precisely known resistance shunt, $R_s$, as seen in FIG. 6.

The insertion of the shunt $R_s$ into the circuit has no effect on the measurements if the voltage $|V_s|$ is measured not across the amplifier source by across the terminals of the speaker, as indicated by the locations designated $x$ and $y$. The current $|I_s|$ is determined from $E_{R_s}$ ($x$ to $z$) divided by $R_s$.

The input admittance of the combination of the three elements $a$, $b$ and $c$ in phasor form is $\overline{Y}_{in} = c + j(a\omega - b\omega)$ and the input impedance $\overline{Z}_{in} = 1/\overline{Y}_{in} = 1/(c + j[a\omega - b/\omega])$.

The impedance of $R_c$ and $L_c$ is $R_c + j\omega L_c$. The total impedance of the combination looking into the terminals $x - y$ is:

$$\overline{Z}_t = \overline{Z}_{in} + \overline{Z}_c = \frac{1}{c + j(a\omega - b/\omega)} + (R_c + j\omega L_c)$$

$$+ \frac{[1 + cR_c - \omega L_c(a\omega - b/\omega)] + j[\omega cL_c + R_c(a\omega - b/\omega)]}{c + j(a\omega - b/\omega)} \quad (33)$$

The magnitude of $|Z_t|$ will be measured by the ratio of $|V_s|/|I_s|$ from the VTVM measurements so only the magnitude $|Z_t|$ is needed from Eq. (33). Because the magnitude usually contains radical terms ($\sqrt{\phantom{x}}$ terms) it will be more convenient to refer to $|Z_t|^2$, which is $$\left(\frac{|V_s|}{|I_s|}\right)^2 = |Z_t|^2 = \frac{[1 + cR_c - \omega L_c(a\omega - b/\omega)]^2 + [\omega cL_c + R_c(a\omega - b\omega)]^2}{c^2 + [a\omega - b/\omega]^2} \quad (34)$$

From measurements of $|Z_t|^2$ at three values of known frequencies or ($\omega = 2\pi f$) plus the value of the resonant frequency for the mechanical response parameters of the speaker, it is possible to solve for $a$, $b$, $c$ and $L_c$. Such a solution may be obtained on a digital computer, but even this requires an iteration program with initial or arbitrary assumptions of answers. For the present illustration, a process will be followed step-by-step for the solution for $a$, $b$, $c$ (and $L_c$ although not needed for the model but very necessary for checking the accuracy of the solution).

To obtain a first approximation of $a$, $b$, $c$ and $L_c$ consider the behavior of the electric circuit first at the mechanical resonance condition. The current $I_s$ produces a force $\overline{F}_g = B1\overline{I}_s$ which is used in three components in the mechanical system to produce the force components $F_M$, $F_K$, and $F_D$, described above and corresponding respectively to the equivalent circuits $a$, $b$ and $c$. At resonance the force components $F_M$ and $F_K$ are balanced in magnitude and in a phasor sense $90°$ from $F_D$ and $180°$ from each other. Hence, no component of current from $I_s$ is supplied to the $a$ and $b$ branches of the equivalent circuit and therefore these branches may be considered as removed from the circuit at resonance without influence on $I_s$ and the $Z_t$. Also the frequency at resonance is relatively low so the voltage drop $\omega L_c I_s$ may be considered for a first approximation as negligible. Consequently at resonance the circuit may be considered approximately as $R_c$ and $1/c$ (ohms) in series.

Depending upon the dissipation terms $c$ and $R_c$ in Eq. (34), the resonant frequency may not be determined very accurately from a plot of the total $|Z_t|$ versus frequency. Furthermore, the exact value of the frequency at the resonance of the mechanical parameters is also to be used in the computations.

A phase angle measurement between $I_s$ and $V_s$ is a much more accurate method to determine the mechanical resonant frequency and hence the value of $|Z_t|$ at that frequency. an oscilloscope with one set of deflection plates energized by $I_s R_s$ and the other set of deflection plates energized by $V_s$ will determine quite closely the frequency to produce the in-phase condition corresponding to system resonance. The oscilloscope figure is called a Lissajous figure. The system resonance for an in-phase Lissajous figure is not exactly the same as the mechanical resonance being sought but the error is quite small because the reactive voltage caused by $L_c$ is quite small at this relatively low frequency.

The data for the solid curve of FIG. 4B were taken upon an eight-inch voice coil type speaker mounted on a baffle board in free air. At low frequencies calculations of the ratio of measured voltage $V_s$ to measured current $I_s$ are found to be quite independent of the level of current used. At higher frequencies this is not true, and for a particular frequency $|Z_t|$ may become larger at higher currents.

The assumption that the five parameters $a$, $b$, $c$, $R_c$ and $L_c$ were constants was made in arriving at Eq. (34). In free air $a$, $b$, and $c$ are usually constants.

When the coil carries a current $I_s$, magnetic fields in and adjacent to the current are established. The ferrous pole faces adjacent to the voice coil contain such flux densities caused by the coil current. Power losses occur with changing currents in two forms: (a) hysteresis effects where the losses are proportional to the first power of the frequency and to a higher power of the magnetic flux density, and (b) eddy current losses in the pole faces which are proportional to the square of both the frequency and the magnetic flux densities caused by the changing current.

Figure 4C:
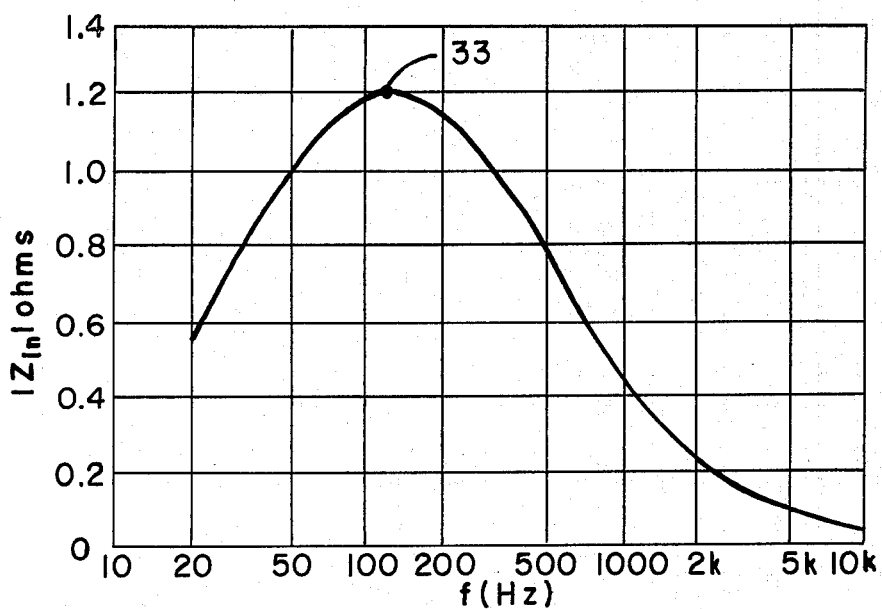
FIG. 4C is a graph of terminal impedance of a speaker, at different frequencies, a function of speaker current.
Figure 4C:
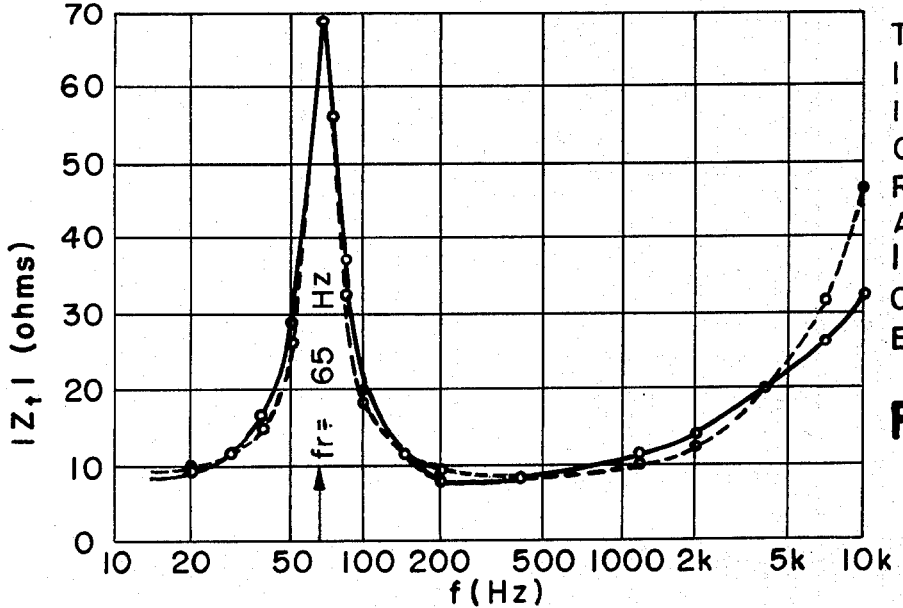
Figure 4C:
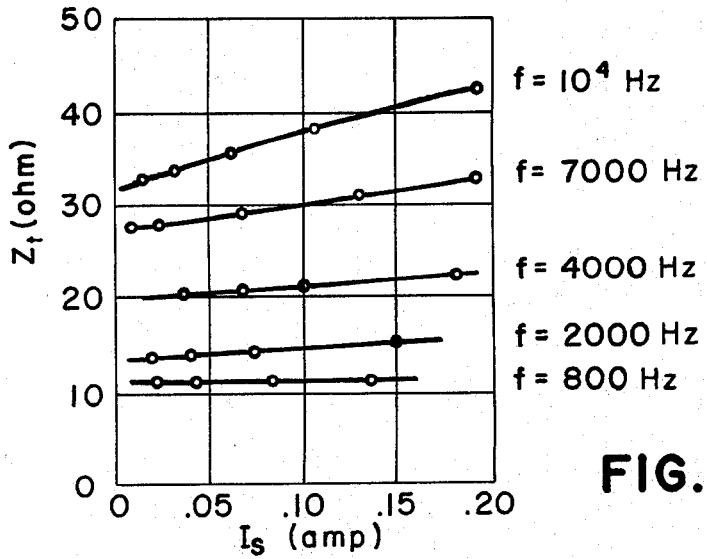

The losses caused by this mechanism can be related to the resistance $R_c$ so that the total resistance is the low frequency value plus a $\Delta R_c$. The $\Delta R_c$ would be zero at any particular frequency if $I_s$ were zero since the current is the cause of the magnetic flux densities $|Z_t|$ can be evaluated at zero current by making a series of measurements of $|Z_t|$ through a range of values of $I_s$, then plotting the impedance as in FIG. 4C as a function of $I_s$, and extrapolating the curves at each particular frequency to zero $I_s$. The intercept values from FIG 4C are then used in plotting the high frequency values for $Z_t$ in the solid curve of FIG. 4B.

Returning now to the step-by-step solution for the parameters. The low-frequency $R_c$ is 8.3 ohms. The $Z_t$ at resonance of the mechanical parameters in FIG. 4B is 69.2 ohms.

Consequently, the first approximation on $c$ would be $$8.3 + (1/c) = 69.2$$
$$(1/c) = 60.9$$

or $c = 0.01642$ (approximation No. 1).

At frequencies less than resonance the $b$ branch of the equivalent circuit increases in current and the current in the $a$ branch decreases and at very low frequencies the current of $a$ could be neglected. Also at low frequencies $L_c$ has even less effect than at resonance and can also be neglected. Using $f = 30$ Hz, where $|Z_t|$ is 11.88 ohms, the remaining circuit is shown in FIG. 7.

The admittance of the $b$ and $c$ parallel branches is $\overline{Y}_{in} = 0.01642 - jb/188.5$ or $\overline{Z}_{in} = 1/(0.01642 - jb/188.5)$, and the series connection of this impedance and the 8.3 ohms resistance of the coil is $$\overline{Z}_t = 8.3 + \frac{1}{0.01642 - jb/188.5}$$

$$= \frac{1.1363 - j(b/188.5)8.3}{0.01642 - jb/188.5}$$

or $$(11.88)^2 = Z_t^2 = \frac{(1.1363)^2 + (b/188.5)^2 \times 68.89}{(0.01642)^2 + (b/188.5)^2}$$

solving for $b$:

$$b = 0.1317 \times 188.5 = 24.827 \text{ (approx. No. 1)} \quad (35)$$

Having determined the mechanical resonance frequency $f_r$ for evaluation of $c$ it can now be used to obtain $a$ from the $b$ just determined. At mechanical resonance $a\omega_r = b/\omega_r$ where $\omega_r = 2\pi f_r$ so $$a = b/(\omega_r)^2 \quad (36)$$

$$a = 24.827/(408.5)^2 = 1.488 \times 10^{-4} \text{ (approx. No. 1)}$$

The circuit of FIG. 6 now has the following values approximately determined all at relatively low frequencies:

$R_c = 8.3$ ohms
$c = 0.01642$ mhos
$b = 24.827$
$a = 1.488 \times 10^{-4}$

If a high frequency is applied, the $-j\,24.827/\omega$ mho branch will possess small current in the equivalent circuit compared with $a$ and $c$ branches. Setting the frequency high in the audio range as 4 kilohertz ($\omega = 62800$) and neglecting the $-J\,24.827/\omega$ the approximate circuit for the 4 kHz is shown in FIG. 8.

The admittance of the $a$ and $c$ branches is $\overline{Y}_{in} = 0.01642 + j\,3.7403$ mhos and $\overline{Z}_{in} = 1/\overline{Y}_{in} = 0.00117 - j\,0.2673$ ohms and the series combination with $\overline{Z}_c$ gives $\overline{Z}_t = 8.3001 + j(25133\,L_c - 0.2673)$. Measured $|Z_t|$ of 19.7 ohms would relate to the equation as $$388.1 = |Z_t|^2 = 69.89 + (25133\,L_c - 0.2673)^2 \quad (37)$$

or, solving for $L_c$, $$L_c = 0.72 \times 10^{-3} \text{ (approximation No. 1)}$$

For a closer approximation on $c$, the approximate data for $a$, $b$ and $L_c$ will be used at the resonant frequency $f_r = 65$ Hz ($\omega = 408.5$) and Equation (34) results in a solution for $c$ as:

$$c = 0.01642 \text{ (approximation No. 2)}$$

which is exactly the same as with the first approximation, so no further approximation for $c$ is necessary.

Now seeking a better value of $b$ with $a$, $c$, and $L_c$ at $f = 30$ Hz ($\omega = 188.5$), and solving for $b$ gives $b = 30.47$ (approximation No. 2). From this a better $a$ can be calculated at resonance as $a = 30.47/(408.5)^2 = 1.825 \times 10^{-4}$ (approx. No. 2) And finally an iteration for $L_c$ using $\omega = 25133$ gives $$L_c = 0.72 \times 10^{-3} \text{ (approximation No. 2)}$$

which is the same as with the first approximation.

Because $c$ and $L_c$ are now established to satisfactory values the iteration plan needs to be continued only with $b$ and $a$ until successive iterations provide satisfactory agreements for desired accuracy. The results for such a procedure give:

Approximations

|   | 1st | 2nd | 3rd | 4th | 5th |
|---|---|---|---|---|---|
| c | 0.01642 | 0.01642 | | | |
| b | 24.83 | 30.47 | 31.67 | 31.93 | 31.98 |

Approximations-continued

| | 1st | 2nd | 3rd | 4th | 5th |
|---|---|---|---|---|---|
| a | $1.488 \times 10^{-4}$ | $1.825 \times 10^{-4}$ | $1.899 \times 10^{-4}$ | $1.913 \times 10^{-4}$ | $1.917 \times 10^{-4}$ |
| $L_c$ | $0.72 \times 10^{-3}$ | $0.72 \times 10^{-3}$ | | | |

Thus, it has been demonstrated how it is possible to determine the four parameters, $a$, $b$, $c$ and $L_c$ from three measured impedances; one at high and one at low frequencies, and another at the resonance frequency where the value of the resonant frequency is quite accurately determined by an in-phase Lissajous figure on an oscilloscope.

Verification that the parameters represent the total impedance characteristic over the frequency spectrum can be accomplished by calculating the input or terminal impedance from the five parameters $a$, $b$, $c$, $R_c$ and $L_c$ as illustrated in Table I. Results from this tabulation are plotted as the dashed curve of FIG. 4B. Except at very high frequencies the match to the measured data curve is very close for the free air speaker.

FIGS. 9, 10 and 11 illustrate performance characteristics of the same speaker when mounted in a vented or reflex type enclosure. The solid curve of FIG. 9 is the measured total input impedance as a function of frequency. The enclosing of the speaker results in a shift of the mechanical response parameter resonance to a higher frequency.

Modes of vibration in the vented enclosure produce one or more nonlinear mechanical parameters. The very low frequency response is radially changed when this particular speaker is enclosed in the particular enclosure. The combination is used as an example of adapting the invention to a particular situation and there is no intention that the combination is an optimum situation.

At low frequencies the spring parameter $b$ is the predominant factor in the total impedance $Z_t$, so the radical change in the character of $Z_t$ at the lower frequencies (including the shift in resonant frequency) is most probably caused by a change in the basic value of $b$ including variation due to nonlinear frequency behavior. In the region of resonance the peak $Z_t$ is distorted and lowered from the free air value.

An approximate model can be derived from the free air parameter. If the resonance curve shape on the rising sides are carried upward in a normal fashion until they join above the blunted peak, a "phantom" height of about 55 ohms can be determined for computing the parameter $c$. Assuming the mass parameter $a$ is invariant, and knowing the new resonant frequency $f_r = 101$ hertz, an equivalent constant parameter $b$ may be computed from a $\omega_r = b/\omega_r$. The computation of the total impedance curve from the new $c$ and $b$ values with $a$, $R_c$ and $L_c$ from the free air suspension yields the dashed curve of FIG. 9 as a very reasonable fit by a constant parameter set of data to the actual nonlinear curve.

FIG. 10 demonstrates the performance data for the signal processing stage. The gain $g_1$ of the controlled output voltage amplifier (dashed curve) droops at high frequencies for two reasons, the compensation model imposes a relatively heavy current load at the higher frequencies and the particular amplifier used employed a transformer coupled output.

The input current to the electrical compensation model of the mechanical response parameters is given by the solid curve $I_1$ of FIG. 10. A limiting action of $I_1$ at the higher frequencies was designed by matching $R_s$ (FIG. 5) to $1/[\omega(C'/k)]$ at a frequency of about 2,000 Hz. to prevent excessive current from signals of very high frequency. For the particular design of the model, $C'/k$ was $1.64 \times 10^{-6}$ farads and $R_s$ of 46 ohms provided a limiting action becoming effective at $$f = \frac{1}{2\pi R_s \left(\frac{C'}{k}\right)} = \frac{10^6}{2\pi \times 64 \times 1.64} = 2100 \text{ Hz.}$$

The model parameter $c$ was artificially increased above the calculated value ($k$ R decreased) to increase the low frequency response to match rooms with predominance in the high frequency range. The current $I_1$ is thus higher at its minimum point that that which would have resulted from the calculated $kR$.

FIG. 11 illustrates the data from the power amplifier stage. The gain $g_2$ ($I_2/I_1R_s$) is essentially flat over the entire audio range. The signal as processed by the com- Table I Calculated $Z_t$ from Parameters of
$a = 1.917 \times 10^{-4}$, $R_c = 8.3$
$b = 31.98$, $L_c = 0.72 \times 10^{-3}$
$c = 0.01642$ ($w = 2\pi f$)

| f | aw | b/w | h(aw − b/w) | Zabc | jwLc | Zt |
|---|---|---|---|---|---|---|
| 20 | .0241 | .2545 | −j.2304 | .31+j 4.32 | +j.09 | 9.67 ∠27° |
| 30 | .0361 | .1697 | −j.1335 | .91+j 7.38 | j.14 | 11.89 ∠39° |
| 40 | .0482 | .1272 | −j.0791 | 2.52+j12.13 | j.18 | 16.39 ∠49° |
| 50 | .0602 | .1018 | −j.0416 | 8.22+j20.81 | j.23 | 26.75 ∠52° |
| 65 | .0783 | .0783 | j.0 | 60.90+j0 | j.29 | 69.20 ∠0.2° |
| 70 | .0843 | .0727 | +j.0116 | 40.63−j28.70 | j.32 | 56.56 ∠−30° |
| 80 | .0964 | .0636 | +j.0327 | 12.24−j24.41 | j.36 | 31.63 ∠−49° |
| 100 | .1205 | .0509 | +j.0696 | 3.22−j13.62 | j.45 | 17.50 ∠−49° |
| 150 | .1807 | .0339 | +j.1467 | .75−j 6.73 | j.68 | 10.89 ∠−34° |
| 200 | .2409 | .0255 | +j.2154 | .35−j 4.61 | j.90 | 9.41 ∠−23° |
| 400 | .4818 | .0127 | +j.4691 | .07−j 2.13 | j1.81 | 8.38 ∠−2° |
| 800 | .9636 | .0064 | +j.9572 | .02−j 1.04 | j3.62 | 8.71 ∠17° |
| 1.2k | 1.4454 | .0042 | +j1.441 | .01−j 0.69 | j5.43 | 9.57 ∠30° |
| 2k | 2.4089 | .0025 | +j2.406 | 0−j0.42 | j9.05 | 11.97 ∠46° |
| 4k | 4.8180 | .0013 | +j4.817 | 0−j0.21 | j18.10 | 19.72 ∠65° |
| 7k | 8.4313 | .0007 | +j8.431 | 0−j0.12 | j31.67 | 32.62 ∠75° |
| 10k | 12.045 | .0005 | +j12.044 | 0−j0.08 | j45.24 | 45.90 ∠80° | pensation model as included in thus faithfully reproduced in the voice coil current. The voltage resulting on the output of this current controlled amplifier is shown by the lower dotted curve $V_t$. The peak in the region of resonance would have been less pronounced if the value $kR$ of the compensation model had not been artificially reduced below the calculated valve. This was done for better base response for the particular room environment, as mentioned.

The current $I_2$ from about 200 to 2,000 Hz, in these data possesses values very close to the theoretical currents needed to provide velocities of the speaker cone which are faithful reproductions of the input electrical signal to the total system.

The quality of reproduction of music and voice signals of transient form is excellent. The faithful reproduction in both magnitude and phase of every component tone from 200 to 2,000 Hz. and the approximate reproduction below 200 and above 2,000 hertz provides remarkable performance from a single inexpensive speaker mounted in a very solid internally padded vented enclosure. No mechanical noise problems exist even at very high level (within the signal capabilities of the amplifiers) and the total sound reproduction is excellent.

After the values of the electrical model network are determined to compensate the system speaker, it may be desirable for some purposes to adjust the compensation. It is possible to modify the corresponding $\omega C'$ or $1/\omega L$ terms of the model by consciously choosing values of $C'$ or $1/L$ that are either larger or smaller than the measured values for exact compensation. A reduction in $C'$ will result in a reduction in the high frequency response with no appreciable change in the low frequency, whereas an increase in $C'$ will result in an increase in the high frequency response. In a similar manner, if only $1/L$ is increased ($L$ decreased) there will be an increase in the low frequency response with no appreciable change in the high frequency response; and a reduction in $1/L$ (increase in $L$) yields a corresponding reduction in the low frequency response.

When the mechanical resonance occurs at the low end of the frequency spectrum it is possible to provide emphasis to the lower frequencies by simply increasing the $c$ of the model (or decreasing $kR$) without changing $a$ or $b$. By this process the resonance frequency of the model is still matched to the speaker (or other transducer) so that except near the resonance frequency the model still compensates for magnitude and phase over the majority of the frequency spectrum. Thus, additional emphasis of low frequencies causes no deterioration in the high frequency compensation. This is in contrast with some conventional systems wherein compensation at one end of the frequency spectrum also alters response, undesirably, at other portions of the spectrum.

Ideally, the parameters of inductance, capacitance and resistance should have the same characteristics as the mechanical parameters of the system being modeled. If the mechanical parameters are constants, that is, not functions of the magnitude of mechanical action or variable with frequency, then the electric model parameters should likewise be constant. Any mechanical parameter that is non-linear or is frequency-sensitive should preferably be matched by a corresponding, non-linear or frequency-sensitive electric element in the model network 42. Such matching possibilities may be achieved in some cases through use of magnetic or dielectric material resistors, saturating inductors, non-linear dielectrics in capacitors, or piecewise combinations of such elements with linear elements and using Zener diodes with combinations of elements.

In the absence of such non-linear or frequency-sensitive devices, a match using constant electric model elements at three strategic frequencies, (1) a low range, (2) resonance, (3) a high range, will achieve excellent performance even with small variance in response at frequencies between these three points.

An alternative embodiment of the invention is a system wherein both the low-power or signal processing stage and the high-power stage are current-controlled amplifiers. The signal processing stage includes an electrical compensation network containing a series circuit including a capacitor, inductor and resistor which are analogs of the respective mechanical response parameters of the speaker. With proper coupling from the compensation or model network, a properly compensated signal is generated and applied to the high-power amplifier which, in turn, drives the speaker.

Turning then to FIG. 12, reference numeral 51 again represents the input voltage signal $E_S$. This signal is fed to the input of a first current amplifier 55. The output signal of the amplifier 55 is a current $I_1$, which is coupled to a model or compensation network generally designated 56 and including a series circuit with capacitor $C_1$, resistor $R_1$, and inductor $L_1$. Connected across the series compensation network 56 is a second current amplifier 57 having a gain, $g_2 = I_2/E_{S2}$. The output of the current amplifier 57, $I_2$ is fed to the speaker, generally designated 59, and bearing the same symbols as previously discussed speakers.

To simplify equations, the following notations will be used: $Z_M$ will represent the complex impedance of the compensation network 56, $Z_C$ will represent the impedance of $R_C$ and $L_C$, and $Z_S$ will represent the impedance of the mechanical response parameters $C'$, $R$ and $L$.

From FIG. 12, the following equations may be derived:

$$I_1 = g_1 E_s \tag{A1}$$

$$E_{S2} = I_1 Z_M = g_1 E_S Z_M \tag{A2}$$

$$I_2 = g_2 E_{S2} = g_1 g_2 E_S Z_M \tag{A3}$$

$$E_L = _{12} Z_S = g_1 g_2 E_S Z_M Z_S \tag{A4}$$

Referring to the equation (A4), it will be observed that the first three terms are frequency independent. Hence, if the produce $Z_M$ and $Z_S$ can be made to be independent of frequency, compensation of the mechanical response parameters of the speaker will have been accomplished. $Z_M$ and $Z_S$ are defined as follows:

$$Z_m = [R + j(\omega L - 1/\omega C)]k \tag{A5}$$

and $$Z_S = \frac{1}{c + j(\omega a - b/\omega)} \tag{A6}$$

If the following relationships are then made, the result of equation (A4) will be independent of frequency, regardless of the value of $k$, $$R = c, L = a, \text{ and } C' = 1/b.$$

Hence, the configuration of FIG. 12 with the relationships just established is an alternative method of compensating for the mechanical response parameters of a speaker of the type which which the present invention is concerned.

Turning now to the embodiment of FIG. 13, there is shown still another alternative for compensating for the mechanical response characteristic of an electromagnetic transducer which operates on the Bli principle. In this case, the transducer is the recording mechanism of a strip chart recorder. It has mechanical and electrical parameters which are the equivalent of a moving-coil type of speaker; however, in this case, the angular displacement $\theta$, rather than the velocity v is the variable for which compensation is to be provided. In other words, an arm is mounted to a shaft, and the arm carries the recording instrument. A graph paper may be passed beneath the arm, and the displacement of the recording instrument is recorded on the chart. The angular displacement of the arm is a measure of the parameter being recorded.

Turning then to FIG. 13, reference numeral 51 again designates the input voltage signal $E_S$ which in this embodiment feeds a current amplifier 55. The output current of the amplifier 55, $I_1$, is fed to the compensation network 56 which is similar to the compensation network 56 of FIG. 12, in the sense that designations and configuration are the same, but the values of $C_1$, $R_1$ and $L_1$, of course, depend upon the mechanical response parameters and the electrical parameters of the strip chart recorder which is diagrammatically shown in the dashed box 70.

A buffer amplifier 60 is responsive to the signal developed across the network 56 and generates a corresponding output voltage $E_2$ which is applied to a differentiating network 61 including capacitor $C_2$ and a resistor $R_2$ connected in the circuit configuration shown. The buffer amplifier 60 is a linear amplifier having a high input impedance so as not to distort the signal developed across the compensation or model network 56.

The signal developed across resistor $R_2$ of the differentiating network 61 is fed to a current amplifier 62, again having a high input impedance, the output current of which is designated I and drives the mechanism of the strip chart recorder 70.

As has been mentioned above, the strip chart recorder is a displacement device rather than a velocity device such as a speaker. Hence, the differentiating network 61 is used, it being realized that velocity is the first time derivative of displacement.

Let
$J =$ moment of inertia of coil
$D =$ dissipation parameter
$K =$ spring elastance Torque = force $f$ x moment arm $L = BlLi$ $$= J \frac{d^2\theta}{dt^2} + D \frac{d\theta}{dt} + K\theta \quad \text{(B1)}$$

If $i = I_{max} \sin(\omega t + \alpha)$ and $$\theta = \theta_{max} \sin(\omega t)$$

$$\frac{d\theta}{dt} = \omega \theta_{max} \cos(\omega t) \quad \text{(B2)}$$

$$\frac{d^2\theta}{dt^2} = -\omega^2 \theta_{max} \sin(\omega t) \quad \text{(B3)}$$

If $\bar{I} = I_{max} \epsilon^{j(\omega t + \alpha)}$ $\bar{\theta} = \theta_{max} \epsilon^{j\omega t}$ $$\frac{d(\bar{\theta})}{dt} = +j\omega \theta_{max} \epsilon^{j\omega t} \quad \text{(B4)}$$

$$\frac{d^2(\bar{\theta})}{dt^2} = -\omega^2 \theta_{max} \epsilon^{j\omega t} \quad \text{(B5)}$$

As phasors $$\bar{T} = BlL\bar{I} = -\omega^2 J\bar{\theta} + j\omega D\bar{\theta} + K\bar{\theta} \quad \text{(B6)}$$
$$= [K + j\omega D - \omega^2 J] \bar{\theta} \quad \text{(B7)}$$

$$\bar{\theta} = \frac{(BlLl)\bar{I}}{K + j\omega D - \omega^2 J} \quad \text{(B8)}$$

$\bar{I}_1 = g_1 \bar{E}_s$ $\bar{E}_1 = \bar{I}_1 [-j 1/\omega C_1 + R_1 + j\omega L_1]$
$\bar{E}_2 = g_2 \bar{E}_1$ $\bar{I}_2 = j\omega C_2 \bar{E}_2$ (where $R_2 \ll \frac{1}{\omega C_2}$)

$\bar{E}_3 = \bar{I}_2 R_2$ $\bar{I}$ (current driving the pen of strip chart movement)

$\bar{I} = g_3 \bar{E}_3$

Combining all parts $$\bar{T} = g_1 g_2 g_3 (j\omega C_2 R_2) [-j \frac{1}{\omega C_1} + R_1 + j\omega L_1] \bar{E}_s \quad \text{(B9)}$$

$$\bar{T} = g_1 g_2 g_3 C_2 R_2 [\frac{1}{C_1} + j\omega R_1 - \omega^2 L_1] \bar{E}_s \quad \text{(B10)}$$

and $$\bar{\theta} = (BlL) g_1 g_2 g_3 C_2 R_2 \left[ \frac{\frac{1}{C_1} + j\omega R_1 - \omega^2 L_1}{[K + j\omega D - \omega^2 J]} \right] \bar{E}_s \quad \text{(B11)}$$

If $1/C_1 = K$; $R_1 = D$; $L_1 = J$ or scaled by a factor k $[1/C_1] = K$, etc., then $\bar{\theta} = k$ (BlL) $g_1 g_2 g_3 C_2 R_2 \bar{E}_s$ and there is no error in $\bar{\theta}$ as a function of $\bar{E}_s$ in either magnitude or phase. The differentiating circuit requires that $R_2 \ll 1/C_2$ for the highest frequency component of a complex wave for which faithful reproduction of the strip chart recorder is to be obtained. Because the differentiating circuit rejects currents of zero frequency, the compensation system provided herein must be used in conjunction with a conventional direct-coupled deflection system to provide the total response from zero frequency upward to the highest frequency for which faithful reproduction is to be obtained.

Having thus described in detail a preferred embodiment of the invention, persons skilled in the art will be able to modify certain of the structure which has been illustrated and to substitute equivalent elements for those disclosed while continuing to practice the principle of the invention; and it is, therefore, intended that all such modifications and substitutions be covered as they are embraced within the spirit and scope of the appended claims.

I claim:

1. In combination with an electro-mechanical transducer having mechanical response parameters of known value and including current-carrying conductor means in a magnetic field wherein the response characteristic of said transducer is a known function of the frequency of the drive current in said conductor means, the improvement comprising: drive circuit means receiving an input signal for supplying a drive current to said current-carrying conductor means of said transducer; and compensation network means in circuit with said drive circuit means for modifying the frequency characteristic and the input signal to be the complement of the frequency response characteristic of said transducer, said compensation network means including resistive, capacitive and inductive components each having a value determined by a corresponding one of the mechanical response parameters of said transducer.

2. The apparatus of claim 1 wherein said drive circuit means further includes a current amplifier driving said transducer and having a high output impedance relative to the ohmic resistance and self-inductance of said transducer.

3. The apparatus of claim 2 wherein the frequency response characteristic of said transducer is a velocity response characteristic and said mechanical response parameters of said transducer include mass, a spring value and a dissipation value; and wherein said compensation network comprises said resistive, capacitive and inductive components connected in parallel circuit with each other, said compensation network resistive value being inversely proportional to the dissipation value of said transducer, said compensation network inductive value being inversely proportional to said spring value of said transducer, and said compensation network capacitive value being proportional to the mass of said transducer.

4. The apparatus of claim 3 further comprising circuit means receiving the output signal of said compensation circuit means for generating an input signal to said current amplifier.

5. The apparatus of claim 4 further comprising voltage amplifier means receiving said input signal and having a low output impedance relative to the magnitude of the impedance of said compensation network, the output of said voltage amplifier means being coupled to the input of said compensation network.

6. The apparatus of claim 2 wherein the frequency response characteristic of said transducer is a velocity response characteristic and said mechanical response parameters of said transducer include mass, a spring value and a dissipation value; and wherein said compensation network comprises said resistive, capacitive and inductive components connected in series circuit with each other, said compensation network resistive value being proportional to the dissipation value of said transducer, said compensation network inductive value being proportional to the mass of said transducer, and said compensation network capacitive value being inversely proportional to the spring value of said transducer.

7. The apparatus of claim 6 further comprising a current amplifier having a high output impedance receiving said input signal and having its output coupled to said compensation network.

8. The apparatus of claim 2 wherein the frequency response characteristic of said transducer is a displacement response characteristic and said mechanical response parameters of said transducer include mass, a spring value and a dissipation value; and further comprising differentiating circuit means for differentiating the output signal of said compensation network means, the output of said differentiating circuit means being coupled to said current amplifier.

9. The apparatus of claim 8 wherein said compensation network comprises resistive, capacitive and inductive components connected in series circuit with each other, said compensation network resistive value being proportional to the dissipation value of said transducer, said compensation network inductive value being proportional to the mass of said transducer, and said compensation network capacitive value being inversely proportional to the spring value of said transducer.

10. In combination with an electro-mechanical transducer including mechanical response parameters of known value and including displaceable means including current-carrying conductor means in a magnetic field wherein the force on said displaceable means depends on the drive current in said conductor means and wherein the resulting velocity response characteristic of said transducer is a known function of the frequency of the drive current, the improvement comprising: compensation network means receiving an input signal and having an impedance characteristic as a function of frequency such that the resulting output signal thereof is the complement of the frequency-dependent velocity response characteristic of said transducer; and amplifier means having an output impedance larger than the impedance comprising the ohmic resistance and self inductance of said transducer and receiving the input signal as modified by said compensation network means for driving said transducer.

11. The apparatus of claim 10 wherein said amplifier means is a current amplifier having an output impedance which is large in relation to the combined magnitude of the ohmic resistance and self inductance of said transducer for the frequency range over which said transducer is intended to operate.

12. The apparatus of claim 10 wherein said displaceable means of said transducer has a mass, and a suspension system having a spring value and a dissipation value, said dissipation being representative of friction losses and losses in converting electrical power to acoustic power, said network means including a capacitance value representative of said mass of said displaceable means, an inductance value representative of said spring value for the suspension system of said displaceable means, and a resistance value representative of the dissipation losses of said transducer means.

13. The apparatus of claim 12 wherein said capacitance, inductance and resistance of said compensation network are connected in parallel, said system further comprising voltage amplifier means receiving the input signal and driving said compensation network means; and shunt resistance means connected between the output of said network means and the input of said current-controlled amplifier and having resistance value which is very much less than the impedance value of said compensation network means for the frequency range over which said transducer is intended to operate.

14. Apparatus for driving an electro-mechanical transducer including displaceable means and having mechanical response parameters of mass, spring value and dissipation value and exhibiting a known relationship between the velocity of the displaceable means of the transducer and the frequency of a driving signal, comprising: first amplifier means comprising a voltage-controlled amplifier receiving the input signal for amplifying the same; compensation network means having impedance elements each representative of a corresponding electrical equivalent element of a mechanical response parameter of said transducer, said compensation network receiving the output signal of said first amplifier for modifying said signal to have a frequency characteristic which is the complement of the velocity response characteristic of the mechanical response parameters of said transducer; and current amplifier means receiving the output signal of said compensation network means for driving said transducer, said current amplifier having an output impedance which is greater than the magnitude of the impedance of said transducer for the entire frequency range over which said tranducer is intended to operate.

15. Apparatus for driving an electro-mechanical transducer including displaceable means and having mechanical response parameters of mass, spring value and dissipation value, and exhibiting a known relationship between the velocity of the displaceable means of the tranducer and the frequency of the input signal, comprising: first amplifier means comprising a current amplifier receiving the input signal for amplifying the same; compensation network means having impedance elements of resistance, capacitance and inductance, each representative of a corresponding electrical equivalent element of one of said mechanical response parameters, said elements of said compensation network being connected in series circuit and receiving the output signal of said first current amplifier for modifying said signal to have a frequency characteristic which is the complement of the velocity response characteristic of the mechanical response parameters of said transducer; and second current amplifier means receiving the output signal of said compensation network means for driving said transducer, said first and second current amplifiers having respective output impedances which are greater than the magnitude of their associated load impedances for the frequency range over which said transducer is intended to operate.

16. Apparatus for driving an electro-mechanical transducer including displaceable means and having mechanical response parameters of mass, spring value and dissipation value, and exhibiting a known relationship between the displacement of said displaceable means of said transducer and the frequency of a driving signal, comprising compensation network means receiving an input signal and having impedance elements of resistance, capacitance and inductance, each element representative of a corresponding electrical equivalent element of a mechanical response parameter of said transducer, said compensation network means modifying said input signal to have a frequency characteristic which is the complement of the velocity response characteristic of the mechanical response parameters of said transducer; differentiating circuit means receiving the output signal of said compensation network means for differentiating the same; whereby the output signal of said differentiating circuit means is compensated for the displacement characteristic of said transducer; and current amplifier means receiving the output signal of said differentiating network means for driving said transducer, said current amplifier means having an output impedance which is greater than the magnitude of the impedance of said transducer for the frequency range over which said transducer is intended to be used.

17. The apparatus of claim 16 wherein the elements of said compensation network means are connected in series circuit, and said resistive element of said compensation network is proportional to the dissipation value of said transducer, the inductive element of said compensation network means is proportional to the mass of said displaceable means of said transducer, and the capacitive element of said compensation network means is inversely proportional to the spring value of said transducer.

18. The apparatus of claim 16 wherein the elements of said compensation network means are connected in parallel circuit with each other and said resistive element is inversely proportional to the dissipation value of said transducer, the inductive element of said compensation network means is inversely proportional to the spring value of said transducer, and the capacitive element of said compensation network means is proportional to the mass of the displaceable means of said transducer.

19. A method of compensating for the frequency dependent response characteristic of a transducer having mechanical response parameters of mass, spring value, and dissipation value, comprising: determining values for the electrical equivalent circuit elements for the mechanical response parameters for said transducer including a resistive element, an inductive element and a capacitive element, each element representative of a corresponding electrical equivalent of a mechanical response parameter of said transducer; forming a compensation network of a second resistor, a second capacitor and a second inductor, the value of each being uniquely determined by an associated equivalent circuit element of the mechanical response parameters of said transducer; coupling an input signal to said compensation network to modify said input signal; and driving said transducer with a current corresponding to the input signal as modified by said compensation network.

20. The method of claim 19 wherein said response characteristic of said transducer is a displacement characteristic and further comprising the step of differentiating the output signal of said compensation network and prior to driving said transducer with the modified signal.

* * * * *

UNITED STATES PATENT OFFICE
CERTIFICATE OF CORRECTION

Patent No. 3,988,541  Dated October 26, 1976

Inventor(s) Warren B. Boast

It is certified that error appears in the above-identified patent and that said Letters Patent are hereby corrected as shown below:

Column 3, line 36, change "current" to --circuit--.
Column 3, line 64, change "diagram" to --diaphragm--.
Column 4, equation (2), the equal sign and everything to the left of it should be vertically centered on the division line.
Column 5, line 60, change "$I_c$" to --$\bar{I}_c$--.
Column 5, equation (14), change "F" to --$\bar{F}$--.
Column 6, line 14, change F to --$\bar{F}$--.
Column 6, line 63, change "electical" to --electrical--.
Column 8, line 58, change "b" to --B--.
Column 10, line 51, change "$\bar{I}_2$" (second occurrence) to --$\bar{I}_1$--.
Column 10, equation (29), right side, "$I_2$" should be --$\bar{I}_2^1$--.
Column 11, line 26, change "32" to --=--.
Column 12, line 5, change "+" to --=--.
Column 13, line 25, insert a period after "densities".
Column 14, line 25, change "J" to --j--.
Column 18, equation (A4), delete "$1_2$" to --$I_2$--.
Column 18, equation (A5), change "$Z_m^2$" to --$Z_M^2$--.
Claim 1, line 3, change "valve" to --value--.
In FIG. 5, change "K" above element 44 to --k--.

Signed and Sealed this

Twenty-sixth Day of April 1977

[SEAL]

Attest:

RUTH C. MASON
Attesting Officer

C. MARSHALL DANN
Commissioner of Patents and Trademarks